(12) United States Patent
Yamaguchi et al.

(10) Patent No.: US 11,791,139 B2
(45) Date of Patent: Oct. 17, 2023

(54) SUBSTRATE SUPPORT

(71) Applicant: Tokyo Electron Limited, Tokyo (JP)

(72) Inventors: Shin Yamaguchi, Miyagi (JP);
Yasuharu Sasaki, Miyagi (JP); Koei Ito, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 36 days.

(21) Appl. No.: 17/653,165

(22) Filed: Mar. 2, 2022

(65) Prior Publication Data
US 2022/0285138 A1    Sep. 8, 2022

(30) Foreign Application Priority Data

Mar. 8, 2021 (JP) .................................. 2021-036683

(51) Int. Cl.
*H01J 37/32* (2006.01)
*H01L 21/683* (2006.01)

(52) U.S. Cl.
CPC .. *H01J 37/32724* (2013.01); *H01J 37/32541* (2013.01); *H01J 37/32697* (2013.01); *H01L 21/6833* (2013.01)

(58) Field of Classification Search
CPC ........... H01L 21/67109; H01L 21/6833; H01L 21/6875; H01J 37/32541; H01J 37/32697; H01J 37/32724

USPC .......................................................... 361/234
See application file for complete search history.

(56) References Cited

U.S. PATENT DOCUMENTS

| 2015/0279632 A1* | 10/2015 | Lin ................... | H01J 37/32541 |
| | | | 438/798 |
| 2020/0194240 A1* | 6/2020 | Sasaki ............... | H01J 37/32577 |

FOREIGN PATENT DOCUMENTS

| CN | 1577791 A | * | 2/2005 | ............. H01L 21/68 |
| JP | 2008-042140 | | 2/2008 | |

OTHER PUBLICATIONS

Machine Translation of Kumar Chinese Patent Document CN 1577791 A Feb. 9, 2005 (Year: 2005).*

* cited by examiner

*Primary Examiner* — Kevin J Comber
(74) *Attorney, Agent, or Firm* — IPUSA, PLLC

(57) ABSTRACT

A substrate support includes a base, a substrate support layer disposed on the base, the substrate support layer being formed of an insulating material, and an electrostatic internal electrode layer disposed in the substrate support layer, the electrostatic internal electrode layer including a body portion and a plurality of protruding portions, the body portion having a circular shape in a plan view, and the plurality of protruding portions radially protruding from the body portion.

18 Claims, 13 Drawing Sheets

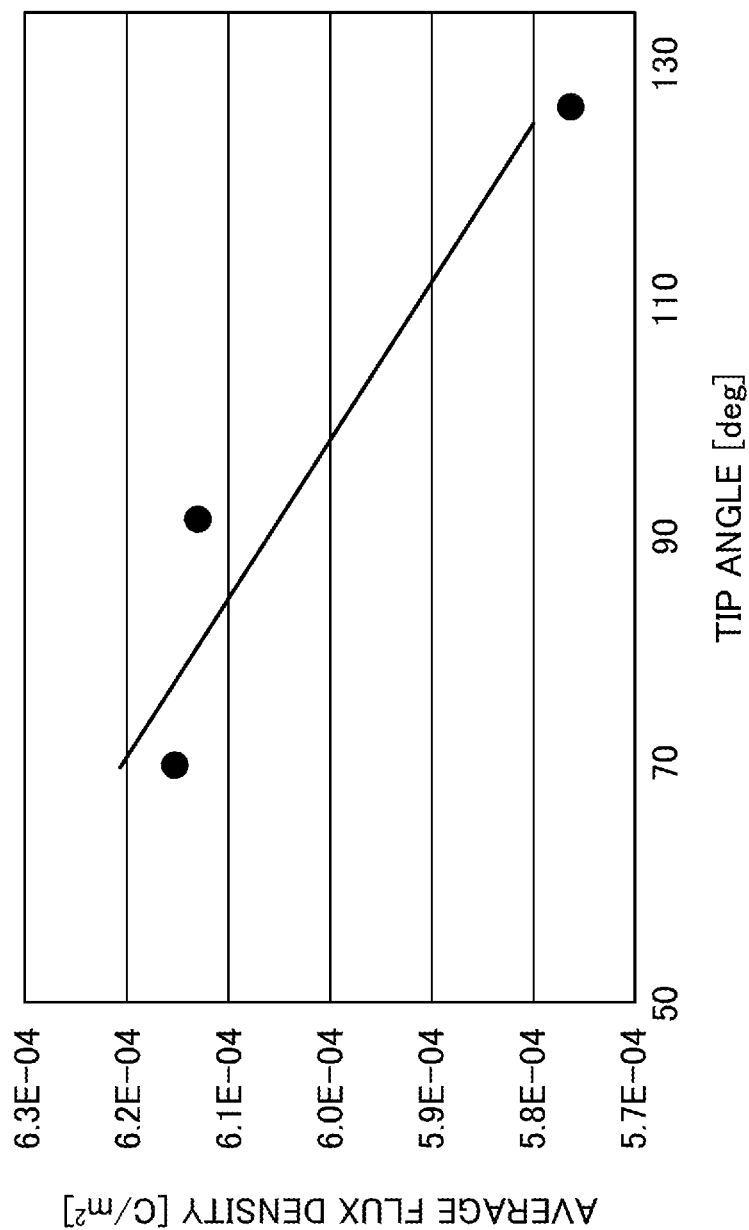

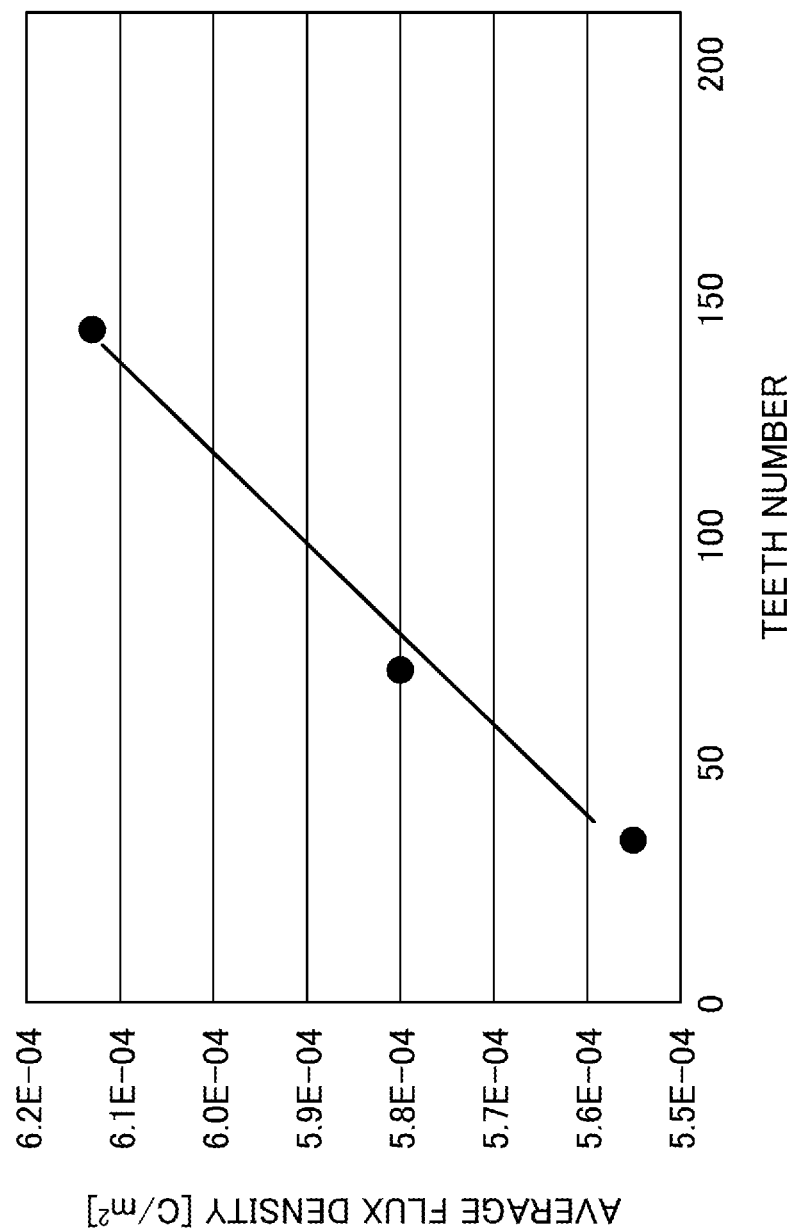

SUBSTRATE SUPPORT

CROSS-REFERENCE TO RELATED APPLICATIONS

This patent application is based on and claims priority to Japanese Patent Application No. 2021-036683 filed on Mar. 8, 2021, the entire contents of which are incorporated herein by reference.

TECHNICAL FIELD

The present disclosure relates to a substrate support.

BACKGROUND

For example, in a plasma processing system in which a substrate such as a wafer is subjected to a predetermined process, a substrate support that supports the substrate is known.

Patent Document 1 describes an electrostatic chuck device including an electrostatic chuck including a base that has one main surface used as a mount surface on which a plate sample is mounted and that includes an internal electrode for electrostatic attraction within the base, and a power supply terminal that applies a DC voltage to the internal electrode for electrostatic attraction, and a metal base portion that is fixed to another main surface of the base of the electrostatic chuck to be integrated with the base and serves as an electrode for high-frequency generation.

RELATED ART DOCUMENT

Patent Document

[Patent Document 1] Japanese Laid-open Patent Application Publication No. 2008-42140

SUMMARY

According to one aspect of the present disclosure, a substrate support includes a base, a substrate support layer disposed on the base, the substrate support layer being formed of an insulating material, and an electrostatic internal electrode layer disposed in the substrate support layer, the electrostatic internal electrode layer including a body portion and a plurality of protruding portions, the body portion having a circular shape in a plan view, and the plurality of protruding portions radially protruding from the body portion.

BRIEF DESCRIPTION OF THE DRAWINGS

FIG. 7A and FIG. 7B are graphs illustrating an example of simulation results indicating a relation between an outer peripheral shape of the electrostatic electrode layer and the average flux density;

FIG. 13A and FIG. 13B are graphs illustrating an example of simulation results indicating a relation between the outer peripheral shape of the electrostatic electrode layer and the average flux density.

DETAILED DESCRIPTION OF EMBODIMENTS

Figure 1:
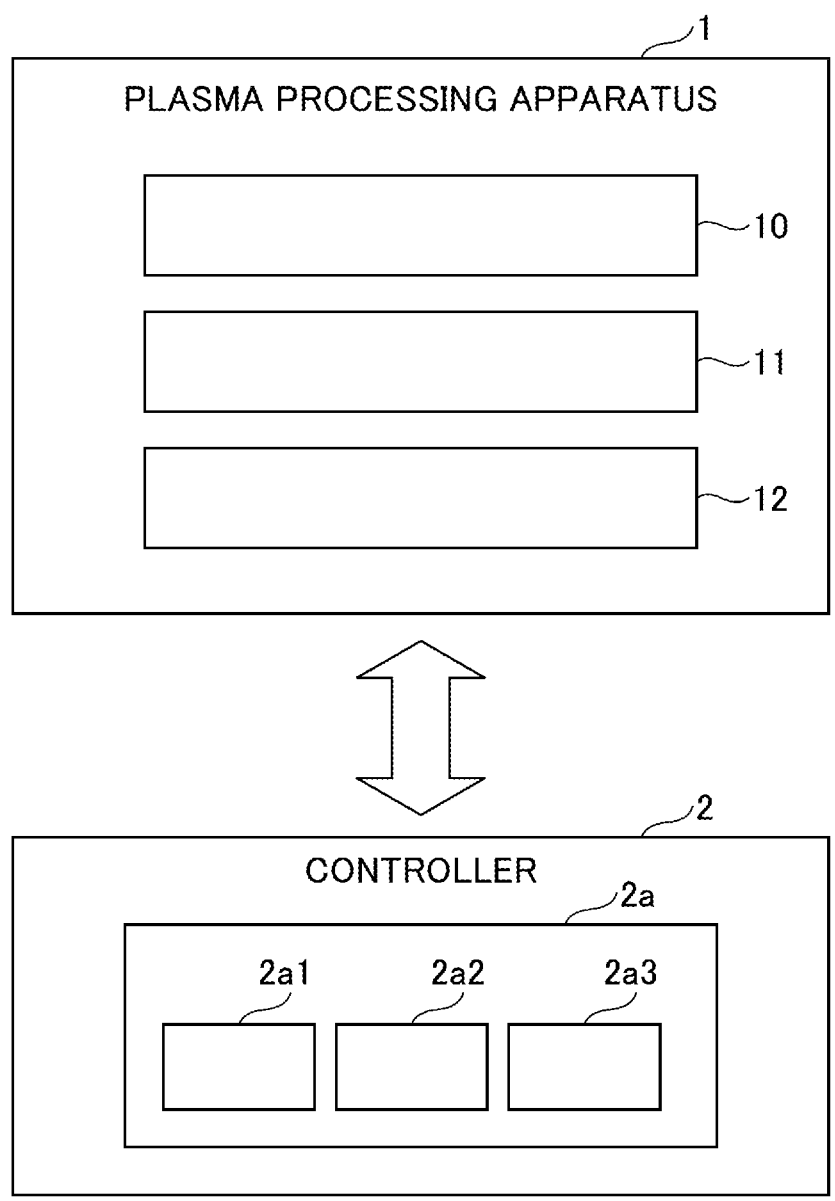
FIG. 1 is a configuration diagram of an example of a plasma processing system.

In a plasma processing system, the heat of a plasma enters a substrate supported by a substrate support. Therefore, it is desirable to improve the in-plane uniformity of the temperature of the substrate supported by the substrate support.

In one aspect, the present disclosure provides a substrate support that improves the in-plane uniformity of the temperature of a substrate.

In the following, various exemplary embodiments will be described in detail with reference to the drawings. Here, the same or correspondent components in each drawing are referenced by the same reference numerals.

Figure 2:
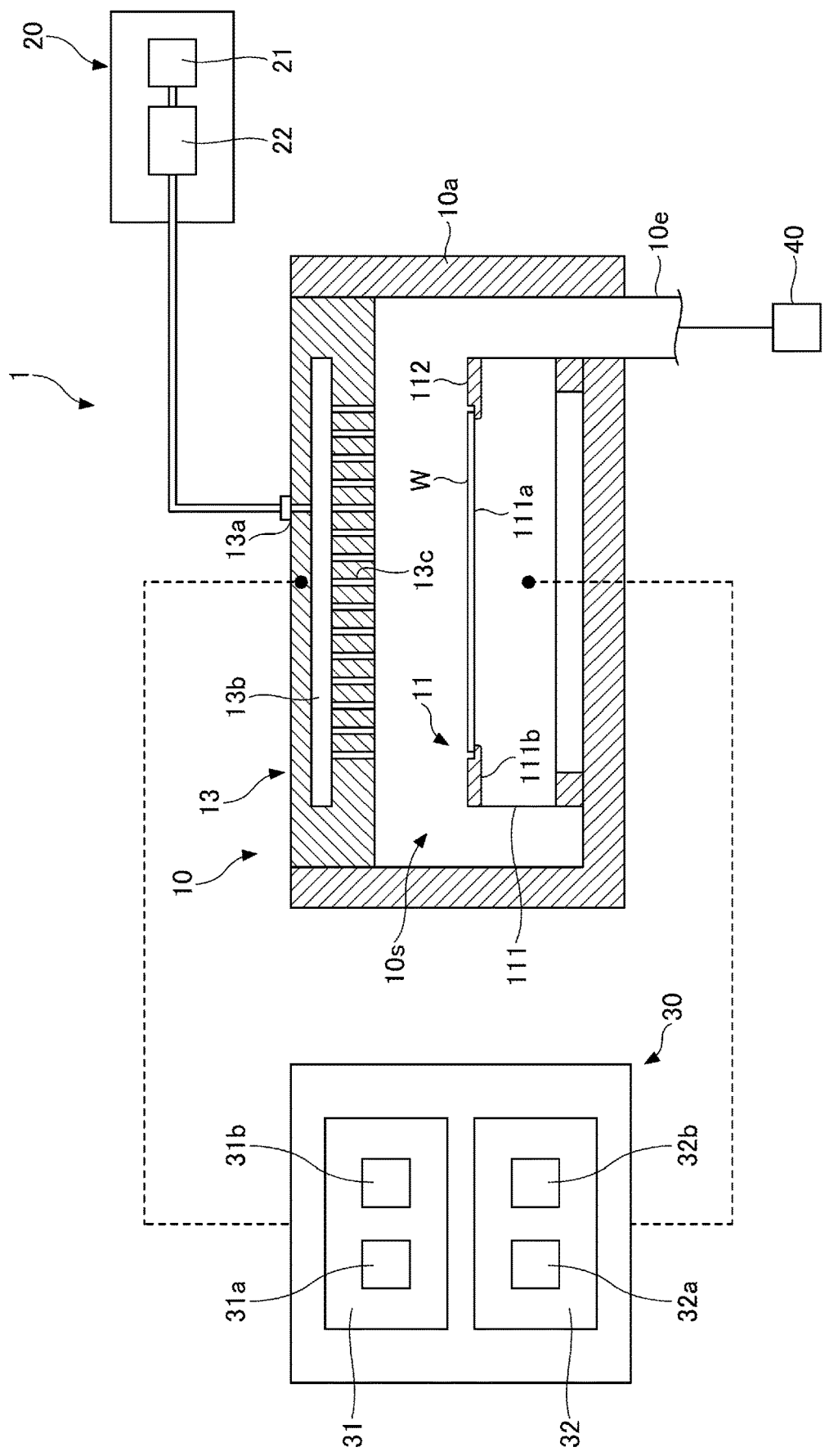
FIG. 2 is a configuration diagram of an example of a plasma processing apparatus.

A plasma processing system will be described with reference to FIG. 1. FIG. 1 is a configuration diagram of an example of the plasma processing system. FIG. 2 is a configuration diagram of an example of a plasma processing apparatus 1.

In one embodiment, the plasma processing system includes the plasma processing apparatus 1 and a controller 2. The plasma processing apparatus 1 includes a plasma processing chamber 10, a substrate support 11, and a plasma generator 12. The plasma processing chamber 10 has a plasma processing space. Additionally, the plasma processing chamber 10 includes at least one gas inlet for supplying at least one processing gas to the plasma processing space and at least one gas outlet for exhausting gas from the plasma processing space. The gas inlet is connected to a gas supply 20, which will be described later, and the gas outlet is connected to an exhaust system 40, which will be described later. The substrate support 11 is disposed in the plasma processing space and has a substrate support surface for supporting a substrate.

The plasma generator 12 is configured to generate a plasma from at least one processing gas supplied into the plasma processing space. The plasma formed in the plasma processing space may be a capacitively coupled plasma (CCP), an inductively coupled plasma (ICP), an electron-cyclotron-resonance (ECR) plasma, a helicon wave excited plasma (HWP), a surface wave plasma (SWP), or the like. Additionally, various types of plasma generators may be used, including an alternating current (AC) plasma generator and a direct current (DC) plasma generator. In one embodiment, an AC signal (AC power) used in the AC plasma generator has a frequency in the range of 100 kHz to 10 GHz. Therefore, the AC signal includes a radio frequency (RF) signal and a microwave signal. In one embodiment, the RF signal has a frequency in the range of 200 kHz to 150 MHz.

The controller 2 processes computer-executable instructions that cause the plasma processing apparatus 1 to perform the various steps described in the present disclosure. The controller 2 may be configured to control respective elements of the plasma processing apparatus 1 to perform the various steps described herein. In one embodiment, a portion or an entirety of the controller 2 may be included in the plasma processing apparatus 1. The controller 2 may include, for example, a computer 2a. The computer 2a may include, for example, a central processing unit (CPU) 2a1, a storage unit 2a2, and a communication interface 2a3. The central processing unit 2a1 may be configured to perform various control operations based on a program stored in the storage unit 2a2. The storage unit 2a2 may include a random access memory (RAM), a read only memory (ROM), a hard disk drive (HDD), a solid state drive (SSD), or a combination thereof. The communication interface 2a3 may communicate with the plasma processing apparatus 1 through a communication line such as a local area network (LAN).

In the following, a configuration example of a capacitively coupled plasma processing apparatus as an example of the plasma processing apparatus 1 will be described. The capacitively coupled plasma processing apparatus 1 includes the plasma processing chamber 10, the gas supply 20, a power supply 30, and the exhaust system 40. Additionally, the plasma processing apparatus 1 includes the substrate support 11 and a gas introduction unit. The gas introduction unit is configured to introduce at least one processing gas into the plasma processing chamber 10. The gas introduction unit includes a showerhead 13. The substrate support 11 is disposed within the plasma processing chamber 10. The showerhead 13 is positioned above the substrate support 11. In one embodiment, the showerhead 13 forms at least a portion of a ceiling of the plasma processing chamber 10. The plasma processing chamber 10 has a plasma processing space 10s defined by the showerhead 13, sidewalls 10a of the plasma processing chamber 10, and the substrate support 11. The sidewalls 10a are grounded. The showerhead 13 and the substrate support 11 are electrically insulated from a housing of the plasma processing chamber 10.

The substrate support 11 includes a body 111 and a ring assembly 112. The body 111 has a central region (a substrate support surface) 111a for supporting a substrate (wafer) W and an annular region (a ring support surface) 111b for supporting the ring assembly 112. The annular region 111b of the body 111 surrounds the central region 111a of the body 111 in a plan view. The substrate W is disposed on the central region 111a of the body 111 and the ring assembly 112 is disposed on the annular region 111b of the body 111 to surround the substrate W disposed on the central region 111a of the body 111. In one embodiment, the body 111 includes a base 50 (described below with reference to FIG. 4) and an electrostatic chuck 60 (described below with reference to FIG. 4). The base 50 includes an electrically conductive member. The electrically conductive member of the base 50 serves as a lower electrode. The electrostatic chuck 60 is disposed on the base 50. The upper surface of the electrostatic chuck 60 has a substrate support surface 111a. The ring assembly 112 includes one or more annular members. At least one of the one or more annular members is an edge ring. Additionally, although not illustrated, the substrate support 11 may include a temperature adjusting module configured to adjust at least one of the electrostatic chuck 60, the ring assembly 112, and the substrate W to a target temperature. The temperature adjusting module may include a heater, a heat transfer medium, a flow path, or a combination thereof. A heat transfer fluid, such as brine or gas, flows through the flow path. Additionally, the substrate support 11 may include a heat transfer gas supply configured to supply a heat transfer gas between the back surface of the substrate W and the substrate support surface 111a.

The showerhead 13 is configured to introduce at least one processing gas from the gas supply 20 into the plasma processing space 10s. The showerhead 13 includes at least one gas inlet 13a, at least one gas diffusion space 13b, and multiple gas introduction ports 13c. The processing gas supplied to the gas inlet 13a is introduced into the plasma processing space 10s from the multiple gas introduction ports 13c through the gas diffusion space 13b. Additionally, the showerhead 13 includes an electrically conductive member. The electrically conductive member of the showerhead 13 functions as an upper electrode. Here, the gas introduction unit may include, in addition to the showerhead 13, one or more side gas injectors (SGIs) attached to one or more openings formed in the sidewall 10a.

The gas supply 20 may include at least one gas source 21 and at least one flow controller 22. In one embodiment, the gas supply 20 is configured to supply at least one processing gas from a corresponding gas source 21 to the showerhead 13 through a corresponding flow controller 22. Each flow controller 22 may include, for example, a mass flow controller or a pressure controlled flow controller. In addition, the gas supply 20 may include at least one flow modulation device that modulates or pulses the flow rate of the at least one processing gas.

The power supply 30 includes an RF power supply 31 coupled to the plasma processing chamber 10 through at least one impedance matching circuit. The RF power supply 31 is configured to provide at least one RF signal (RF power), such as a source RF signal and a bias RF signal, to the conductive member of the substrate support 11 and/or the conductive member of the showerhead 13. This forms a plasma from at least one processing gas supplied to the plasma processing space 10s. Thus, the RF power supply 31 can function as at least a part of the plasma generator 12. Additionally, when the bias RF signal is supplied to the conductive member of the substrate support 11, a bias potential is generated in the substrate W, and ion components in the formed plasma can be drawn into the substrate W.

In one embodiment, the RF power supply 31 includes a first RF generator 31a and a second RF generator 31b. The first RF generator 31a is coupled to the conductive member of the substrate support 11 and/or the conductive member of the showerhead 13 through at least one impedance matching circuit and is configured to generate a source RF signal (source RF power) for plasma generation. In one embodiment, the source RF signal has a frequency in the range of 13 MHz to 150 MHz. In one embodiment, the first RF generator 31a may be configured to generate multiple source RF signals having different frequencies. The generated one or more source RF signals are provided to the conductive member of the substrate support 11 and/or the conductive member of the showerhead 13. The second RF generator 31b is coupled to the conductive member of the substrate support 11 through at least one impedance matching circuit and is configured to generate a bias RF signal (bias RF power). In one embodiment, the bias RF signal has a frequency lower than the frequency of the source RF signal. In one embodiment, the bias RF signal has a frequency in the range of 400 kHz to 13.56 MHz. In one embodiment, the second RF generator 31b may be configured to generate multiple bias RF signals having different frequencies. The generated bias RF signal or signals are provided to the conductive member of the substrate support 11. Additionally, in various embodiments, at least one of the source RF signal and the bias RF signal may be pulsed.

Additionally, the power supply 30 may include a DC power supply 32 coupled to the plasma processing chamber 10. The DC power supply 32 includes a first DC generator 32a and a second DC generator 32b. In one embodiment, the first DC generator 32a is connected to the conductive member of the substrate support 11 and is configured to generate a first DC signal. The generated first DC signal is applied to the conductive member of the substrate support 11. In one embodiment, the first DC signal may be applied to another electrode, such as the electrode in the electrostatic chuck 60. In one embodiment, the second DC generator 32b is connected to the conductive member of the showerhead 13 and is configured to generate a second DC signal. The generated second DC signal is applied to the conductive member of the showerhead 13. In various embodiments, the first DC signal and the second DC signal may be pulsed. Here, the first DC generator 32a and the second DC generator 32b may be provided in addition to the RF power supply 31, and the first DC generator 32a may be provided instead of the second RF generator 31b.

The exhaust system 40 may be connected, for example, to a gas outlet 10e provided at the bottom of the plasma processing chamber 10. The exhaust system 40 may include a pressure regulating valve and a vacuum pump. The pressure regulating valve regulates the pressure in the plasma processing space 10s. The vacuum pump may include a turbomolecular pump, a dry pump, or a combination thereof.

Figure 3:
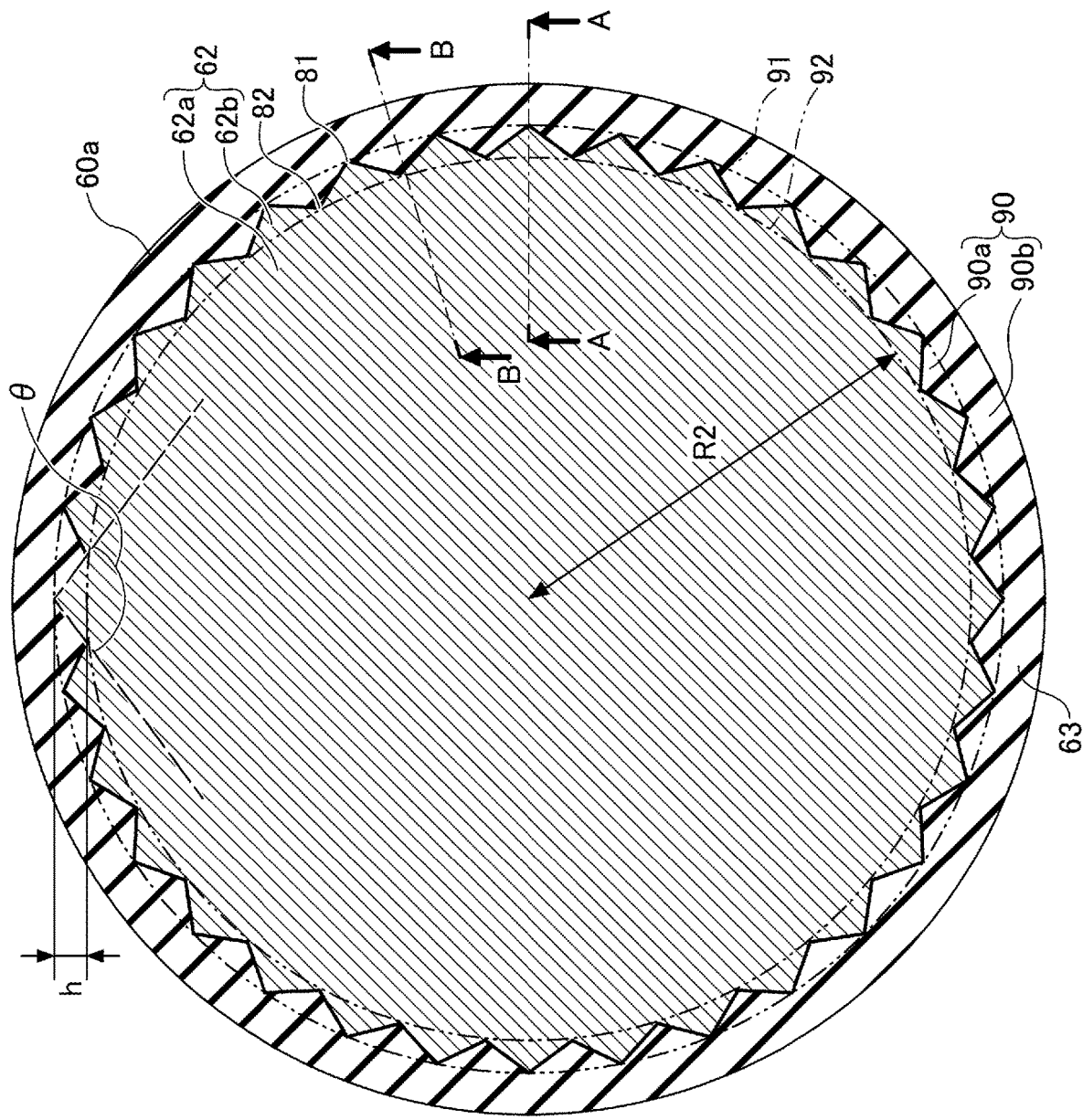
FIG. 3 is a plan view illustrating an example of a shape of an electrostatic electrode layer in an electrostatic chuck of a body of a substrate support.
Figure 4:
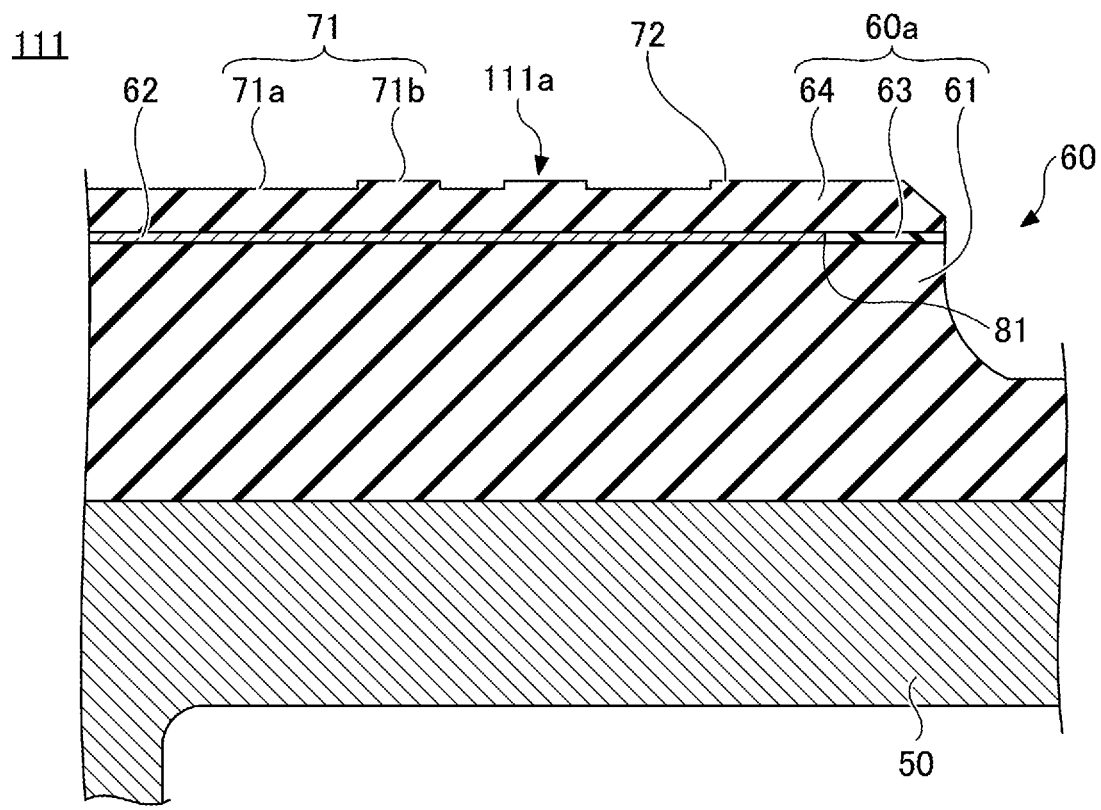
FIG. 4 is an A-A cross-sectional view of the body of the substrate support.
Figure 5:
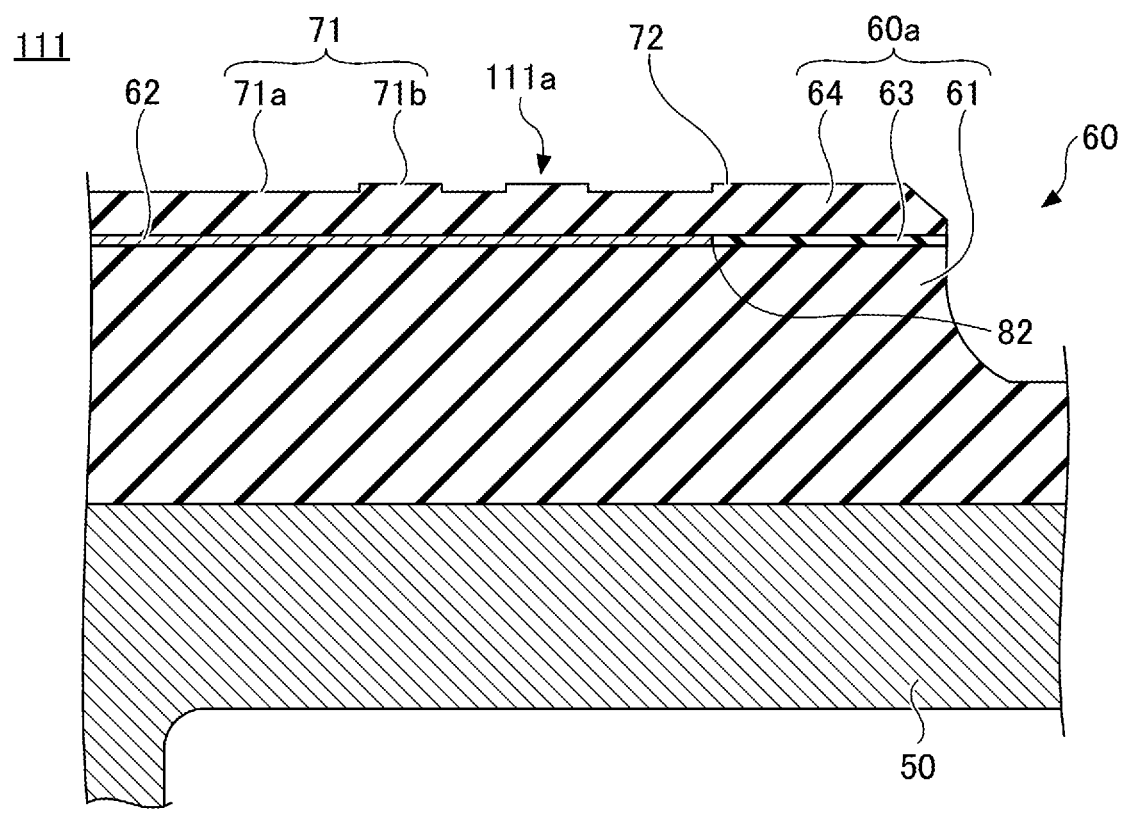
FIG. 5 is a B-B cross-sectional view of the body of the substrate support.

Next, the body 111 of the substrate support 11 will be further described with reference to FIGS. 3 to 5. FIG. 3 is a plan view illustrating an example of a shape of an electrostatic electrode layer 62 in the electrostatic chuck 60 of the body 111 of the substrate support 11. FIG. 4 is an A-A cross-sectional view of the body 111 of the substrate support 11. FIG. 5 is a B-B cross-sectional view of the body 111 of the substrate support 11. Here, FIG. 3 is a diagram illustrating the shape of the electrostatic electrode layer 62 when the electrostatic chuck 60 is viewed in a plan view in a direction from the mounting surface of the substrate W.

The body 111 of the substrate support 11 includes the base 50 and the electrostatic chuck 60 disposed on the base 50. Additionally, the electrostatic chuck 60 includes an insulating material layer (a substrate support layer) 60a and the electrostatic electrode layer (the electrostatic internal electrode layer) 62 disposed within the insulating material layer 60a.

The insulating material layer 60a includes a lower insulator (a lower portion) 61, an intermediate annular insulator (an intermediate annular portion) 63, and an upper insulator (an upper portion) 64. The lower insulator 61 is disposed under the electrostatic electrode layer 62. The upper insulator 64 is disposed on the electrostatic electrode layer 62. The intermediate annular insulator 63 surrounds the electrostatic electrode layer 62 and is disposed between the upper insulator 64 and the lower insulator 61. Here, the insulating material layer 60a may be formed integrally.

The insulating material layer 60a is formed of an insulating material (a dielectric) such as a ceramic material. Here, the lower insulator 61, the intermediate annular insulator 63, and the upper insulator 64 may be formed of the same material or of different materials.

The electrostatic electrode layer 62 is formed of an electrically conductive material such as metal. The electrostatic electrode layer 62 electrostatically attracts the substrate W (see FIG. 2) mounted on the upper surface of the electrostatic chuck 60 by applying a voltage from a power supply (which is not illustrated).

Additionally, the upper surface of the electrostatic chuck 60 (the upper surface of the insulating material layer 60a) has the substrate support surface 111a for supporting the substrate W. The substrate substrate support surface 111a includes an inner periphery 71 and an annular protrusion 72. The inner periphery 71 includes a cut portion 71a and a protrusion 71b standing from the bottom surface of the cut portion 71a. The annular protrusion 72 is formed in an annular shape standing from the bottom surface of the cut portion 71a at the outer peripheral edge of the substrate support surface 111a. Thus, the insulating material layer 60a is disposed throughout the whole circumference of an annular edge region 90 in a plan view and has the annular protrusion 72 protruding upwardly from the upper surface of the insulating material layer 60a.

When the substrate W is supported by the body 111, the upper surface of the protrusion 71b is in contact with the back surface of the substrate W to support the substrate W. Additionally, the upper surface of the annular protrusion 72 is in contact with the outer peripheral edge on the back surface of the substrate W to support the substrate W. The heat transfer gas (for example, He gas) is supplied from the heat transfer gas supply (not illustrated) to a space between the back surface of the substrate W and the substrate support surface 111a that is formed by the cut portion 71a. Additionally, the upper surface of the annular protrusion 72 and the outer peripheral edge on the back surface of the substrate W are in close contact with each other, so that an annular seal band that suppresses leakage of the heat transfer gas is formed. The width of the annular protrusion 72 (the width of the seal band) is in the range of, for example, 1 mm to 5 mm.

Here, as illustrated in FIG. 3, viewed in a direction perpendicular to the substrate support surface 111a, a contour shape of an outer peripheral end of the intermediate annular insulator 63 has a circular shape. With respect to the above, viewed in the direction perpendicular to the substrate support surface 111a, a contour shape of an outer peripheral end of the electrostatic electrode layer 62 has multiple bent portions 81 and 82. In other words, the contour shape of the outer peripheral end of the electrostatic electrode layer 62 has multiple corners. Additionally, the contour shape of the outer peripheral end of the electrostatic electrode layer 62 is formed such that there are no portions parallel to the contour of the outer peripheral end of the intermediate annular insulator 63.

In the example illustrated in FIG. 3, in an inner annular portion (an annular region) 90a formed by an outer circumferential circle 91 and an inner circumferential circle 92, which are indicated by the dash-dot-dot-dash lines, the contour shape of the outer peripheral end of the electrostatic electrode layer 62 is formed so as to zigzag between the outer circumferential circle 91 and the inner circumferential circle 92. When the contour shape of the outer peripheral end of the electrostatic electrode layer 62 turns at the outer circumferential circle 91, a bent portion 81 having a mountain shape (a projecting shape) on an outer side in a radial direction is formed. When the contour of the outer peripheral end of the electrostatic electrode layer 62 turns at the inner circumferential circle 92, a bent portion 82 having a valley shape (a recessed shape) is formed on an inner side in the radial direction. In the following description, the width of the bent portion 81 and the bent portion 82 in the radial direction (the width of the inner annular portion 90a in the radial direction) is also referred to as a mountain-valley length h. Additionally, the angle of the bent portion 81 having the mountain shape is also referred to as a tip angle θ.

Thus, the contour of the electrostatic electrode layer 62 has multiple bent portions 81 and 82 throughout the whole circumference of the annular edge region 90 of the insulating material layer 60a in a plan view. In the example illustrated in FIG. 3, the annular edge region 90 includes the inner annular portion 90a and an outer annular portion 90b. The electrostatic electrode layer 62 has multiple substantially triangular protruding portions 62b arranged throughout the whole circumference of the inner annular portion 90a in a plan view. Each of the multiple protruding portions 62b has a first vertex on the outer circumferential circle 91 of the inner annular portion 90a and a second vertex and a third vertex on the inner circumferential circle 92 of the inner annular portion 90a. The contour of the electrostatic electrode layer 62 has one bent portion 81 at the first vertex of each of the multiple protruding portions 62b in a plan view. Additionally, the contour of the electrostatic electrode layer 62 has the respective bent portions 82 at the second vertex and the third vertex of each of the multiple protruding portions 62b in a plan view.

In other words, the electrostatic electrode layer 62 includes a body portion 62a having a circular shape in a plan view and multiple protruding portions 62b radially protruding from the body portion 62a in a plan view. The number of the protruding portions 62b may be on the order of, for example, tens to tens of thousands. The body portion 62a has a radial dimension R2. Each protruding portion 62b has a substantially triangular shape having the first vertex on the outer circumferential circle 91 of the inner annular portion 90a and the second vertex and the third vertex on the inner circumferential circle 92 of the inner annular portion 90a. That is, each of the multiple protruding portions 62b has a substantially triangular shape having one vertex at the boundary between the inner annular portion 90a and the outer annular portion 90b. Here, the electrostatic electrode layer 62 does not extend to the outer annular portion 90b viewed in a plan view. That is, the outer annular portion 90b does not include the electrostatic electrode layer 62 in a plan view.

Additionally, as illustrated in FIG. 4, the bent portion 81 is positioned below the annular protrusion 72. Also, as illustrated in FIG. 5, the bent portion 82 is positioned below the annular protrusion 72. That is, viewed in the direction perpendicular to the substrate support surface 111a, the inner annular portion 90a is formed to overlap an area of the annular protrusion 72. In other words, viewed in the direction perpendicular to the substrate support surface 111a, the contour shape of the outer peripheral end of the electrostatic electrode layer 62 is formed to overlap the area of the annular protrusion 72.

Figure 6:
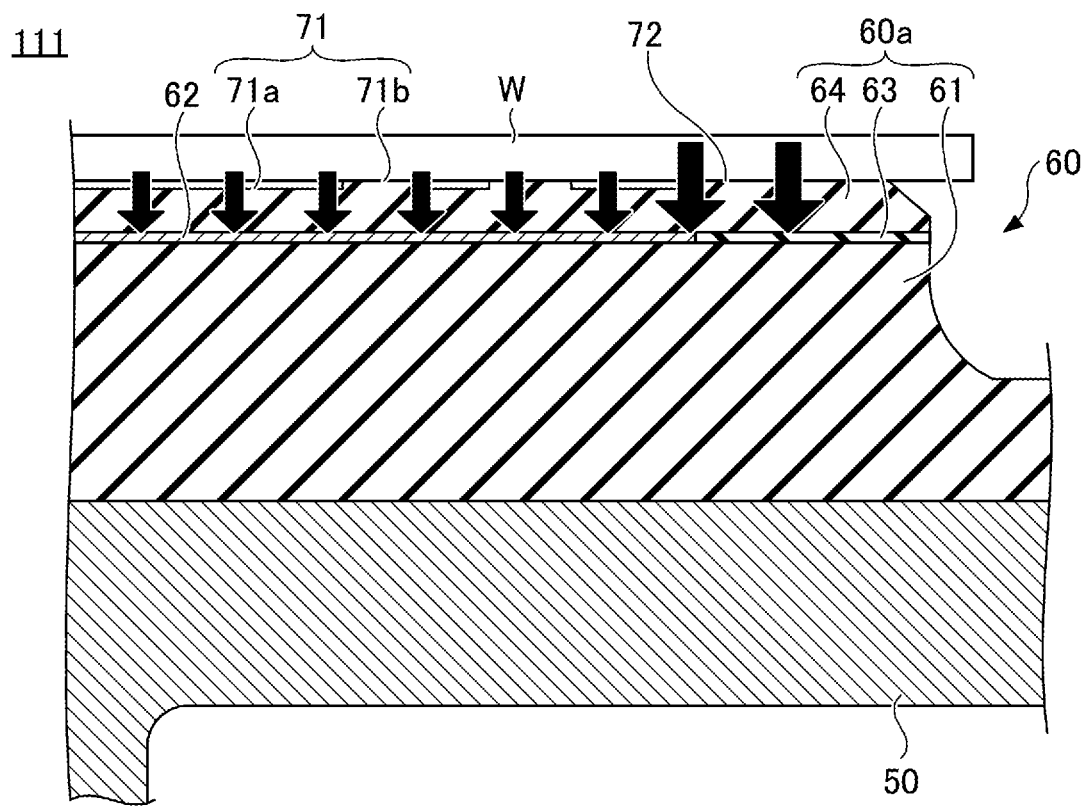
FIG. 6 is a diagram schematically illustrating an electrostatic attraction force between the body of the substrate support and a substrate.

FIG. 6 is a diagram schematically illustrating an electrostatic attraction force between the body 111 of the substrate support 11 and the substrate W. Here, the attraction force that attracts the substrate W is schematically illustrated by an arrow filled in black.

Here, when a voltage is applied to the electrostatic electrode layer 62, an electric field concentration is generated at the bent portions 81 and 82. This can improve the electric field intensity per unit area in the outer peripheral edge of the electrostatic electrode layer 62. In other words, the electric field strength per unit area in the seal band is increased. Therefore, the attraction force in the seal band can be stronger than the attraction force of the inner periphery 71 of the substrate W.

The sealing performance of the seal band formed by the outer peripheral edge on the back surface of the substrate W and the annular protrusion 72 is improved. Additionally, the leakage of the filled heat transfer gas in the outer circumference direction of the substrate W can be prevented. This can uniformize the heat transfer property between the substrate W and the electrostatic chuck 60, and can improve the in-plane uniformity of the temperature of the substrate W. Therefore, in a temperature-dependent process, for example, the in-plane uniformity of the deposition speed (the in-plane uniformity of the film thickness) and the in-plane uniformity of the etch rate can be improved.

Here, a relation between the contour shape of the outer peripheral end of the annular protrusion 72 and the average flux density in the outer peripheral edge of the substrate W will be described. Here, simulations with respect to the substrate support 11 according to the present embodiment and a substrate support of a reference example were performed. Here, the radius of the substrate W was set to be 150 mm, the voltage applied to the electrostatic electrode layer was set to be 4000 V, and the potential of the ring assembly 112 and the substrate W was set to be GND.

Here, the simulation was performed on a substrate support including an electrostatic electrode layer having a circular shape as the substrate support of the reference example. In the substrate support of the reference example, the average flux density in the central portion (an area with a radius of 0 mm to 6 mm) of the substrate W was $4.43\times10^{-4}$ $[C/m^2]$, the average flux density in the outer peripheral edge (an area with a radius of 140 mm or greater) of the substrate W was $4.72\times10^{-4}$ $[C/m^2]$, and the electrostatic energy in the outer peripheral edge (an area with a radius of 140 mm or greater) of the substrate W was $6.31\times10^{-2}$ $[J]$.

With respect to the above, as an example of the substrate support 11 according to the present embodiment, the simulation was performed on the substrate support including an electrostatic electrode layer having an outer circumferential circle 91 of a diameter of 293 mm, a mountain-valley length of h=1.5 mm, 3 mm, and 5 mm, and a tip angle of θ=70 degrees, 91 degrees, and 128 degrees. In the substrate support 11 according to the present embodiment, the average flux density in the central portion (the area having a radius of 0 mm to 6 mm) of the substrate W was $4.43\times10^{-4}$ $[C/m^2]$. It is found that the average flux density of the substrate support 11 is substantially equal to that of the substrate support of the reference example. Additionally, in the substrate support 11 according to the present embodiment, the average flux density of the substrate W at the outer peripheral edge (the area with a radius of 140 mm or greater) was $7.25\times10^{-4}$ $[C/m^2]$, and the electrostatic energy of the substrate W at the outer peripheral edge (the area with a radius of 140 mm or greater) was $7.97\times10^{-2}$ $[J]$. It is found that the average flux density and electrostatic energy are improved in comparison with the substrate support of the reference example. In other words, the attraction force at the outer peripheral edge of the substrate W is improved.

Figure 7A:
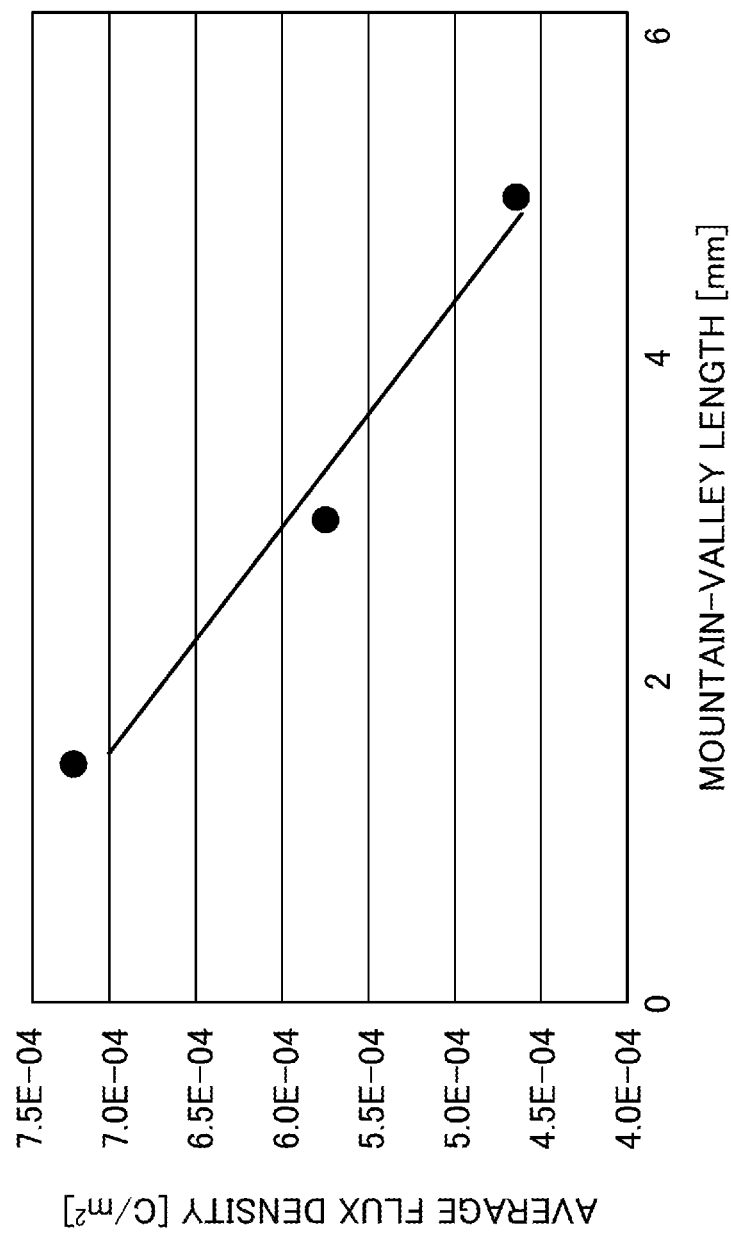

Next, a relation between the outer peripheral shape of the electrostatic electrode layer 62 and the average flux density will be further described with reference to FIG. 7A and FIG. 7B. FIG. 7A and FIG. 7B are graphs illustrating an example of simulation results indicating the relation between the outer peripheral shape of the electrostatic electrode layer 62 and the average flux density.

FIG. 7A is an example of the simulation result indicating a relation between the mountain-valley length h and the average flux density in the outer peripheral edge of the substrate W. Here, the average flux density was calculated with changing the mountain-valley length h. As illustrated in FIG. 7A, it is found that as the mountain-valley length h decreases, the average flux density increases.

Here, the mountain-valley length h is in the range of, for example, 0.1 to 5 mm. That is, the inner annular portion 90a has a width in the range of 0.1 to 5 mm. When the mountain-valley length h is 5 mm or less, the average flux density is improved in comparison with the substrate support of the reference example. If the mountain-valley length h is too small, the electric field concentration decreases.

FIG. 7B is an example of the simulation result indicating a relation between the tip angle θ and the average flux density in the outer peripheral portion of the substrate W. Here, the average flux density was calculated with changing the tip angle θ. As illustrated in FIG. 7B, it is found that the tip angle θ decreases, the average flux density increases.

In one embodiment, the tip angle θ is, for example, 130 degrees or less. That is, each of the multiple protruding portions 62b has an angle θ of 130 degrees or less at a vertex at the boundary between the inner annular portion 90a and the outer annular portion 90b. In one embodiment, the tip angle θ is, for example, 90 degrees or less. That is, each of the multiple protruding portions 62b has an angle θ of 90 degrees or less at a vertex at the boundary between the inner annular portion 90a and the outer annular portion 90b. By setting the tip angle θ to 90 degrees or less, the average flux density is improved in comparison with the substrate support of the reference example.

Here, the shape of the electrostatic electrode layer 62 is not limited to the shape illustrated in FIG. 3. The shape of the electrostatic electrode layer 62 will be further described with reference to FIGS. 8 to 12. In the following FIGS. 8, 9, 11, and 12, the electrostatic electrode layer 62 is illustrated by dividing the electrostatic electrode layer 62 by dash-dot-dot-dash lines to clearly indicate the shape formed by multiple segments (62c, 62d, 62g, and 62h), but the electrostatic electrode layer 62 may be formed integrally including multiple segments.

Figure 8:
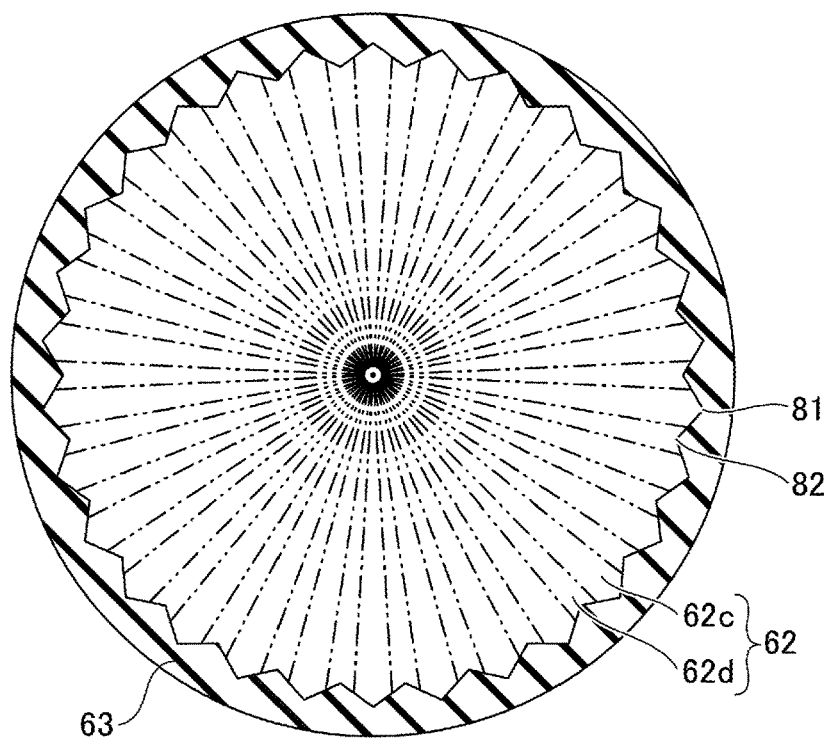
FIG. 8 is a plan view illustrating an example of a shape of the electrostatic electrode layer in the electrostatic chuck.

FIG. 8 is a plan view illustrating an example of the shape of the electrostatic electrode layer 62 within the electrostatic chuck 60. The contour shape of the outer peripheral end of the electrostatic electrode layer 62 illustrated in FIG. 8 is substantially the same as the contour shape of the outer peripheral end of the electrostatic electrode layer 62 illustrated in FIG. 3. The electrostatic electrode layer 62 has a shape in which multiple first segments 62c and multiple second segments 62d are arranged in a circumferential direction. The multiple first segments 62c and the multiple second segments 62d are integrated. That is, the electrostatic electrode layer 62 has the multiple first segments 62c and the multiple second segments 62d that are integrally molded. The first segment 62c has a mountain shape (a projecting shape) on the outer side in the radial direction toward the outer circumferential circle 91 (see FIG. 3). The second segment 62d has a valley shape (a recessed shape) on the inner side in the radial direction toward the inner circumferential circle 92 (see FIG. 3). Additionally, the distances from the outermost circumference of the insulating material layer 60a (the intermediate annular insulator 63) are different between the first segment 62c and the second segment 62d. In the electrostatic electrode layer 62 illustrated in FIG. 8, the first segment 62c and the second segment 62d are alternately arranged. This makes the shape of the electrostatic electrode layer 62 symmetrical with respect to a line passing through the center of the electrostatic chuck 60.

Additionally, in the first segment 62c, the bent portion 81 shaped in a mountain shape (a projecting shape) on the outer side in the radial direction toward the outer circumferential circle 91 (see FIG. 3) is formed. In the second segment 62d, the bent portion 82 shaped in a valley shape (a recessed shape) on the inner side in the radial direction toward the inner circumferential circle 92 (see FIG. 3) is formed. In the second segment 62d adjacent to the first segment 62c, the contour shape formed from the bent portion 81 toward the bent portion 82 is linear.

In other words, the contour shape of the outer peripheral end of the electrostatic electrode layer 62 illustrated in FIG. 8 is formed so as to zigzag between the outer circumferential circle 91 and the inner circumferential circle 92 in the inner annular portion 90a (see FIG. 3) formed by the outer circumferential circle 91 (see FIG. 3) and the inner circumferential circle 92 (see FIG. 3). Specifically, the contour shape of the outer peripheral end of the electrostatic electrode layer 62 illustrated in FIG. 8 is formed by repeatedly arranging a side extending from the outer circumferential circle 91 to the inner circumferential circle 92 (a side extending from the bent portion 81 to the bent portion 82) and a side extending from the inner circumferential circle 92 to the outer circumferential circle 91 (a side from the bent portion 82 to the bent portion 81).

Figure 9:
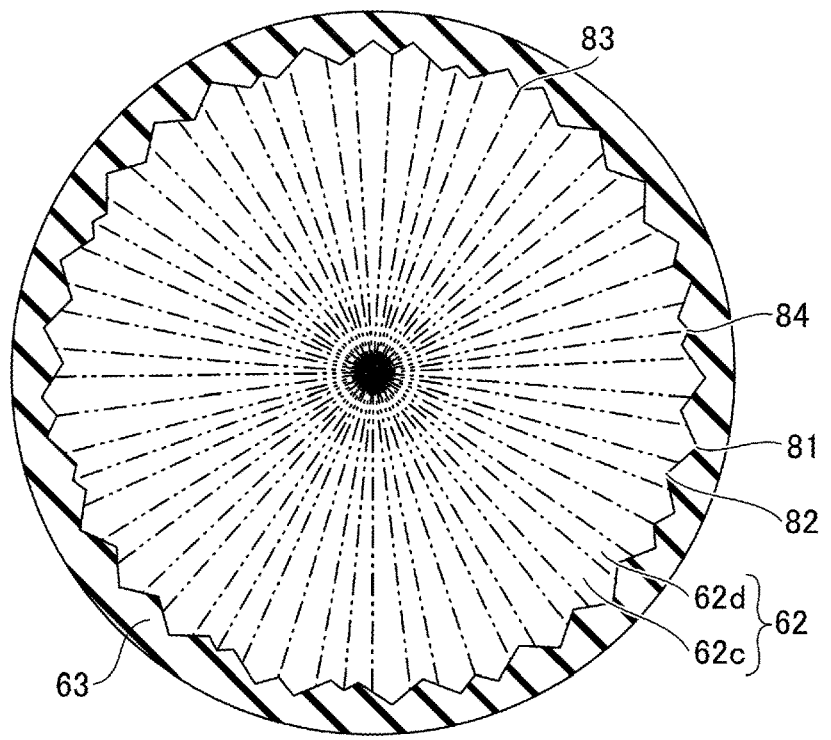
FIG. 9 is a plan view illustrating another example of the shape of the electrostatic electrode layer within the electrostatic chuck.

FIG. 9 is a plan view illustrating another example of the shape of the electrostatic electrode layer 62 within the electrostatic chuck 60. The electrostatic electrode layer 62 has a shape in which the multiple first segments 62c and the multiple second segments 62d are arranged in the circumferential direction. The multiple first segments 62c and the multiple second segments 62d are integrated. That is, the electrostatic electrode layer 62 has the multiple first segments 62c and the multiple second segments 62d that are integrally molded. Additionally, in the electrostatic electrode layer 62 illustrated in FIG. 9, the first segments 62c and the second segments 62d are irregularly disposed. This makes the shape of the electrostatic electrode layer 62 asymmetric with respect to the line passing through the center of the electrostatic chuck 60.

Additionally, in the first segment 62c, the bent portion 81 that is shaped in a mountain shape (a projecting shape) on the outer side in the radial direction toward the outer circumferential circle 91 (see FIG. 3) is formed. In the second segment 62d, the bent portion 82 that is shaped in a valley shape (a recessed shape) on the inner side in the radial direction toward the inner circumferential circle 92 (see FIG. 3) is formed. In the second segment 62d adjacent to the first segment 62c, the contour shape shaped from the bent portion 81 toward the bent portion 82 is linear. In the first segment 62c adjacent to the first segment 62c, a bent portion 83 shaped in a valley shape (a recessed shape) on the inner side in the radial direction is formed. In the second segment 62d adjacent to the second segment 62d, a bent portion 84 shaped in a mountain shape (a projecting shape) on the outer side in the radial direction is formed. The bent portions 83 and 84 are disposed within the inner annular portion 90a.

Figure 10:
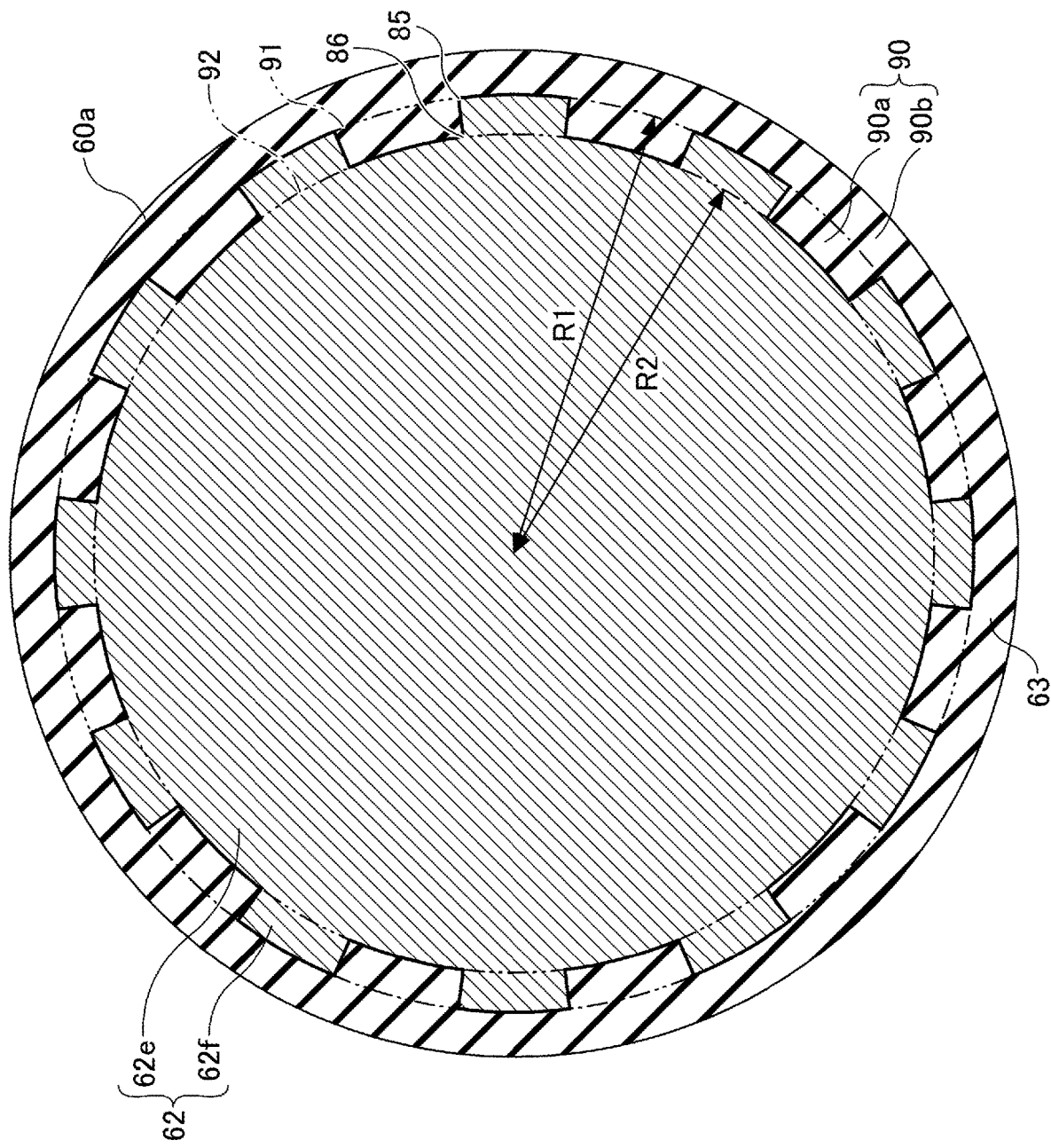
FIG. 10 is a plan view illustrating yet another example of the shape of the electrostatic electrode layer within the electrostatic chuck.

FIG. 10 is a plan view illustrating yet another example of the shape of the electrostatic electrode layer 62 within the electrostatic chuck 60.

The contour shape of the outer peripheral end of the electrostatic electrode layer 62 illustrated in FIG. 10 is formed so as to alternately coincide with the outer circumferential circle 91 and the inner circumferential circle 92 in the inner annular portion 90*a* (see FIG. 3) formed by the outer circumferential circle 91 (see FIG. 3) and the inner circumferential circle 92 (see FIG. 3). Specifically, the contour shape of the outer peripheral end of the electrostatic electrode layer 62 illustrated in FIG. 10 is formed by repeatedly arranging an arc along the outer circumferential circle 91, a side extending from the outer circumferential circle 91 to the inner circumferential circle 92 in the radial direction (a side extending from the bent portion 85 to the bent portion 86), an arc along the inner circumferential circle 92, and a side extending from the inner circumferential circle 92 to the outer circumferential circle 91 in the radial direction (a side extending from the bent portion 86 to the bent portion 85).

Thus, the contour of the electrostatic electrode layer 62 has the multiple bent portions 85 and 86 throughout the whole circumference of the annular edge region 90 of the insulating material layer 60*a* in a plan view. In the example illustrated in FIG. 10, the annular edge region 90 includes the inner annular portion 90*a* and the outer annular portion 90*b*. The electrostatic electrode layer 62 has what is called a gear shape having multiple protruding portions 62*f* that have a substantially rectangular shape and that are arranged throughout the whole circumference of the inner annular portion 90*a* in a plan view. Each of the multiple protruding portions 62*f* has a first vertex and a second vertex on the outer circumferential circle 91 of the inner annular portion 90*a* and a third vertex and a fourth vertex on the inner circumferential circle 92 of the inner annular portion 90*a*. The contour of the electrostatic electrode layer 62 includes respective bent portions 85 at the first vertex and the second vertex of each of the multiple protruding portions 62*f* in a plan view. Additionally, the contour of the electrostatic electrode layer 62 includes respective bent portions 86 at the third vertex and the fourth vertex of each of the multiple protruding portions 62*f* in a plan view.

In other words, the electrostatic electrode layer 62 includes a body portion 62*e* having a circular shape in a plan view and multiple protruding portions 62*f* radially protruding from the body portion 62*e* in a plan view. The number of the protruding portions 62*f* may be on the order of, for example, tens to tens of thousands. The body portion 62*e* has the radial dimension R2. Each protruding portion 62*f* has a substantially rectangular shape with two vertexes on the outer circumferential circle 91 of the inner annular portion 90*a* and two vertexes on the inner circumferential circle 92 of the inner annular portion 90*a*. That is, each of the multiple protruding portions 62*f* has a substantially rectangular shape with two vertices at the boundary between the inner annular portion 90*a* and the outer annular portion 90*b*.

Figure 11:
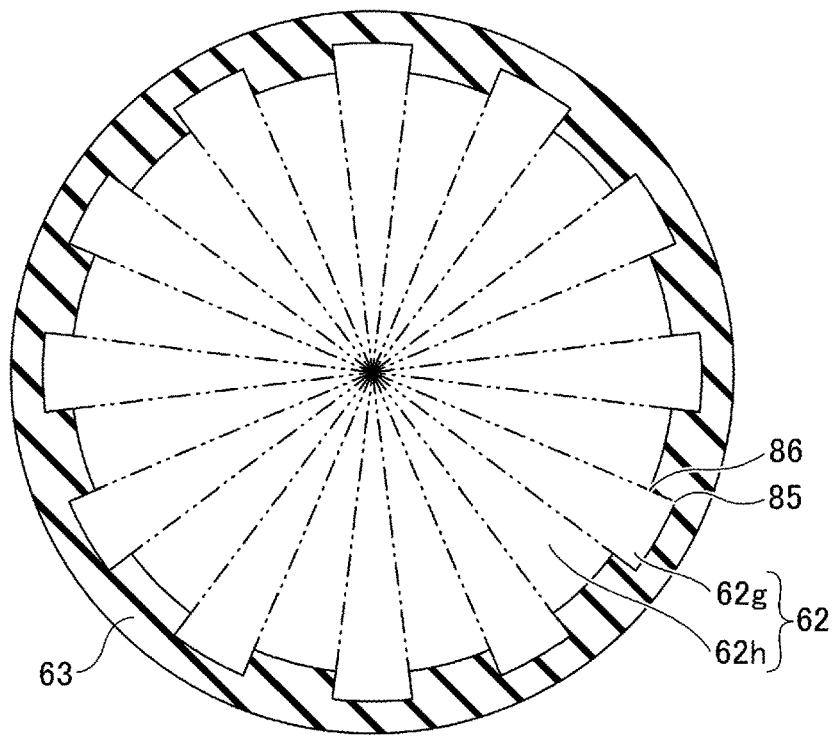
FIG. 11 is a plan view illustrating yet another example of the shape of the electrostatic electrode layer within the electrostatic chuck.

Additionally, the outline shape of the outer peripheral end of the electrostatic electrode layer 62 illustrated in FIG. 10 will be further described with reference to FIG. 11. FIG. 11 is a plan view illustrating yet another example of the shape of the electrostatic electrode layer 62 within the electrostatic chuck 60. Here, the contour shape of the outer peripheral end of the electrostatic electrode layer 62 illustrated in FIG. 11 is substantially the same as the contour shape of the outer peripheral end of the electrostatic electrode layer 62 illustrated in FIG. 10.

The electrostatic electrode layer 62 includes multiple first segments 62*g* and multiple second segments 62*h* alternately arranged in the circumferential direction in a plan view. The multiple first segments 62*g* and the multiple second segments 62*h* are integrated. That is, the electrostatic electrode layer 62 has what is called a gear shape having the multiple first segments 62*g* and the multiple second segments 62*h* that are integrally molded. The first segment 62*g* has a first side formed along the outer circumference of the inner annular portion 90*a* in a plan view. The second segment 62*h* has a second side formed along the inner circumference of the inner annular portion 90*a* in a plan view. The first side and the second side may be straight or curved. Thus, each of the multiple first segments 62*g* has a first radial dimension R1 that is equal to or substantially equal to the outer diameter dimension of the inner annular portion 90*a*, and each of the multiple second segments 62*h* has a second radial dimension R2 that is equal to or substantially equal to the inner diameter dimension of the inner annular portion 90*a*. That is, the second radial dimension R2 is smaller than the first radial dimension R1. The difference between the first radial dimension R1 and the second radial dimension R2 is in the range of 0.1 mm to 5 mm. The contour of the electrostatic electrode layer 62 has two bent portions 85 in each of the multiple first segments 62*g* in a plan view. Additionally, the contour of the electrostatic electrode layer 62 has one bent portion 86 at each junction of the first segment 62*g* and the second segment 62*h* in a plan view.

Additionally, the electrostatic electrode layer 62 has a shape in which the first segments 62*g* and the second segments 62*h* are arranged in the circumferential direction. The first segment 62*g* has a fan shape with an arc along the outer circumferential circle 91 (see FIG. 10). The second segment 62*h* has a fan shape with an arc along the inner circumferential circle 92 (see FIG. 10). Additionally, the distances from the outermost circumference of the insulating material layer 60*a* (the intermediate annular insulator 63) are different between the first segment 62*g* and the second segment 62*h*. Additionally, the second segment 62*h* is formed with a diameter smaller than the diameter of the first segment 62*g*. In the electrostatic electrode layer 62 illustrated in FIG. 11, the first segment 62*g* and the second segment 62*h* are alternately arranged. This makes the shape of the electrostatic electrode layer 62 symmetrical with respect to the line passing through the center of the electrostatic chuck 60.

Additionally, in the first segment 62*g* adjacent to the second segment 62*h*, the bent portion 85 having a mountain shape (a projecting shape) that is formed by an arc of the first segment 62*g* and a side of the first segment 62*g* in the radial direction is formed. Additionally, in the second segment 62*h* adjacent to the first segment 62*g*, the bent portion 86 having a valley shape (a recessed shape) that is formed by an arc of the second segment 62*h* and the side of the first segment 62*g* in the radial direction is formed. The bent portions 85 and 86 are disposed within the inner annular portion 90*a*.

Figure 12:
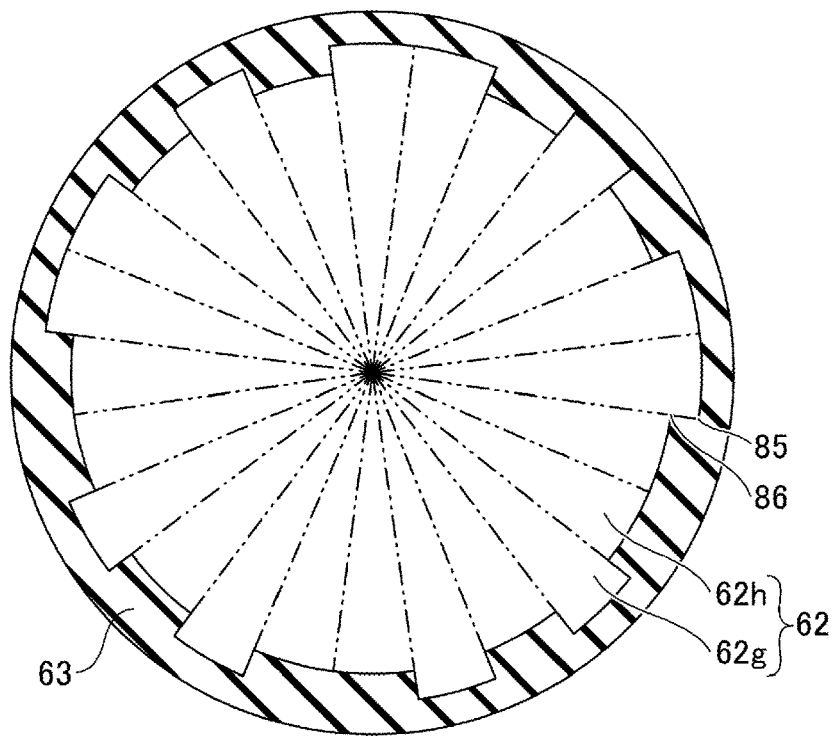
FIG. 12 is a plan view illustrating yet another example of the shape of the electrostatic electrode layer within the electrostatic chuck.

FIG. 12 is a plan view illustrating yet another example of the shape of the electrostatic electrode layer 62 within the electrostatic chuck 60. The electrostatic electrode layer 62 has a shape in which the first segments 62*g* and the second segments 62*h* are arranged in the circumferential direction. Multiple first segments 62*g* and multiple second segments 62*h* are integrated. That is, the electrostatic electrode layer 62 includes the multiple first segments 62*g* and the multiple second segments 62*h* that are integrally molded. Additionally, in the electrostatic electrode layer 62 illustrated in FIG. 12, the first segments 62*g* and the second segments 62*h* are irregularly disposed. This makes the shape of the electrostatic electrode layer 62 asymmetric with respect to the line passing through the center of the electrostatic chuck 60.

Additionally, in the first segment 62*g* adjacent to the second segment 62*h*, the bent portion 85 having a mountain shape (a projecting shape) that is formed by the arc of the first segment 62g and the side of the first segment 62g in the radial direction is formed. Additionally, in the second segment 62h adjacent to the first segment 62g, the bent portion 86 having a valley shape (a recessed shape) that is formed by the arc of the second segment 62h and the side of the first segment 62g in the radial direction is formed. The bent portions 85 and 86 are disposed within the inner annular portion 90a.

Here, the relation between the outer end shape of the annular protrusion 72 and the average flux density at the outer peripheral edge of the substrate W will be described. Here, the simulations are performed on the main body 111 of the substrate support 11 of the present embodiment illustrated in FIG. 11 and the substrate support of the reference example. Here, the radius of the substrate W is set to be 150 mm, the voltage applied to the electrostatic electrode layer is set to be 4000 V, and the potential of the ring assembly 112 and the substrate W is set to be GND.

As an example of the main body 111 of the substrate support 11 of the embodiment illustrated in FIG. 11, the simulation was performed on a substrate support having an electrostatic electrode layer with a diameter of the outer circumferential circle=293 mm, a mountain-valley length (the difference between the diameter of the outer circumferential circle 91 and the diameter of the inner circumferential circle 92) h=1.5 mm, 3 mm, and 5 mm, and the teeth number (the number of first segments 62g)=36, 72, and 144. In the main body 111 of the substrate support 11 of the present embodiment, the average flux density at the central portion (the region having a radius of 0 mm to 6 mm) of the substrate W was $4.43 \times 10^{-4}$ [C/m$^2$]. It is found that the average flux density of the substrate support 11 of the present embodiment is substantially equal to that of the substrate support of the reference example. Additionally, in the main body 111 of the substrate support 11 of the present embodiment illustrated in FIG. 11, the average flux density of the substrate W at the outer peripheral edge (the region with a radius of 140 mm or greater) is $6.05 \times 10^{-4}$ [C/m$^2$], and the electrostatic energy of the substrate W at the outer peripheral edge (the region with a radius of 140 mm or greater) is $7.97 \times 10^{-2}$ [J]. It is found that the average flux density and the electrostatic energy are improved in comparison with the substrate support of the reference example. In other words, the attraction force at the outer peripheral edge of the substrate W is improved.

Figure 13A:
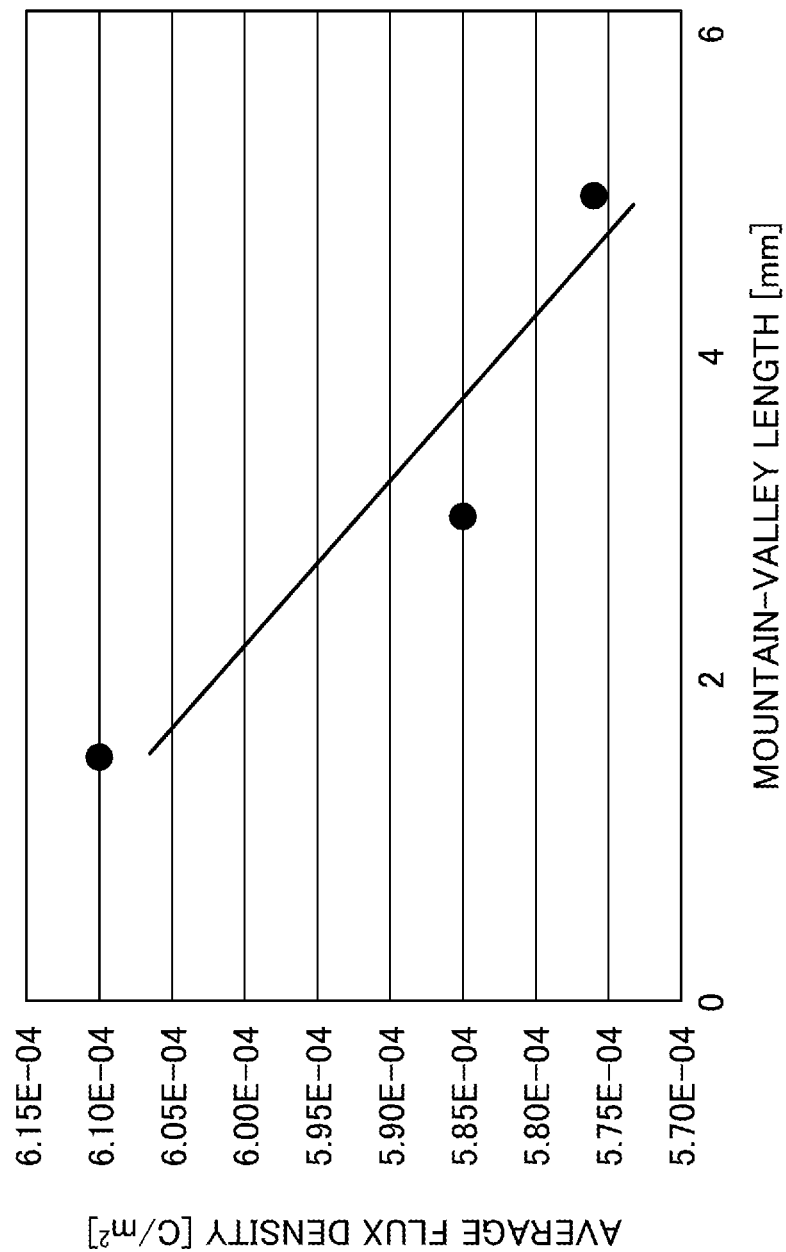

Next, the relation between the outer peripheral shape of the electrostatic electrode layer 62 and the average flux density will be further described with reference to FIG. 13A and FIG. 13B. FIG. 13A and FIG. 13B are graphs illustrating an example of simulation results indicating the relation between the outer peripheral shape of the electrostatic electrode layer 62 and the average flux density.

FIG. 13A is a graph illustrating an example of the simulation result indicating the relation between the mountain-valley length h and the average flux density at the outer peripheral edge of the substrate W. Here, the average flux density was calculated with changing the mountain-valley length h. As illustrated in FIG. 13A, it is found that as the mountain-valley length h decreases, the average flux density increases.

Here, the mountain-valley length h is in the range of, for example, 0.1 mm to 5 mm. That is, the inner annular portion 90a has a width in the range of 0.1 mm to 5 mm. When the mountain-valley length h is 5 mm or less, the average flux density is improved in comparison with the substrate support of the reference example. Additionally, if the mountain-valley length h becomes too small, the electric field concentration decreases.

FIG. 13B is a graph illustrating an example of the simulation result indicating the relation between the teeth number N and the average flux density at the outer peripheral edge of the substrate W. Here, the average flux density was calculated with changing the teeth number (number of teeth) N. As illustrated in FIG. 13B, it is found that as the teeth number N increases, the average flux density increases.

Here, the teeth number N may be on the order of, for example, tens to tens of thousands. As the teeth number N increases, the average flux density is improved in comparison with the substrate support of the reference example.

Although the main body 111 of the substrate support 11 has been described, the present disclosure is not limited to the above-described embodiments and the like, and various modifications and improvements can be made within the scope of the subject matter of the present disclosure as claimed.

In the body 111 of the substrate support 11 illustrated in FIG. 11 and FIG. 12, the first segment 62g and the second segment 62h are described as being formed in a fan shape, but the shape is not limited thereto. The first segment 62g and the second segment 62h may be formed in a triangular shape with a straight line instead of an arc. For example, the contour shape of the outer peripheral end of the electrostatic electrode layer 62 may be formed by repeatedly arranging a side (a chord) connecting two points on the outer circumferential circle 91, a side extending from the outer circumferential circle 91 to the inner circumferential circle 92 in the radial direction, a side (a chord) connecting two points on the inner circumferential circle 92, and a side extending from the inner circumferential circle 92 to the outer circumferential circle 91 in the radial direction.

Additionally, the inner annular portion 90a within which the contour shape of the outer peripheral end of the electrostatic electrode layer 62 is disposed is described as being formed to overlap the area of the annular protrusion 72, but the arrangement is not limited thereto. For example, the outer circumferential circle 91 may be formed to overlap the area of the annular protrusion 72, and the inner circumferential circle 92 may be formed inward from the area of annular protrusion 72. With this arrangement, the bent portions 81 and 85 having a mountain shape (a projecting shape) can be formed to overlap the area of the annular protrusion 72, so that electric field concentration can be generated in the bent portions 81 and 85, thereby improving the seal performance of the seal band.

According to at least one embodiment of the present disclosure, a substrate support that improves the in-plane uniformity of the temperature of a substrate can be provided.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate support comprising:
   a base;
   a substrate support layer disposed on the base, the substrate support layer being formed of an insulating material; and
   an electrostatic internal electrode layer disposed in the substrate support layer, the electrostatic internal electrode layer including a body portion and a plurality of protruding portions, the body portion having a circular shape in a plan view, and the plurality of protruding portions radially protruding from the body portion.

2. The substrate support as claimed in claim 1, wherein the substrate support layer includes an upper portion, a lower portion, and an intermediate annular portion, the upper portion being disposed above the electrostatic internal electrode layer, the lower portion being disposed below the electrostatic internal electrode layer, and the intermediate annular portion surrounding the electrostatic internal electrode layer and being disposed between the upper portion and the lower portion.

3. The substrate support as claimed in claim 2, wherein the insulating material includes a ceramic material.

4. The substrate support as claimed in claim 3,
   wherein the substrate support layer includes an annular protrusion protruding upward from an upper surface of the substrate support layer, and
   wherein the annular protrusion overlaps the plurality of protruding portions in a plan view.

5. The substrate support as claimed in claim 4, wherein the electrostatic internal electrode layer has a symmetric shape in a plan view.

6. The substrate support as claimed in claim 4, wherein the electrostatic internal electrode layer has an asymmetric shape in a plan view.

7. The substrate support as claimed in claim 6,
   wherein the substrate support layer includes an annular edge region in a plan view,
   wherein the annular edge region includes an inner annular portion and an outer annular portion, and
   wherein each of the plurality of protruding portions has a substantially triangular shape having one vertex on a boundary between the inner annular portion and the outer annular portion.

8. The substrate support as claimed in claim 7, wherein the inner annular portion has a width in a range of 0.1 mm to 5.0 mm.

9. The substrate support as claimed in claim 8, wherein each of the plurality of protruding portions has an angle of 90 degrees or less at the vertex.

10. The substrate support as claimed in claim 6,
    wherein the substrate support has an annular edge region in a plan view,
    wherein the annular edge region has an inner annular portion and an outer annular portion, and
    wherein each of the plurality of protruding portions has a substantially rectangular shape having two vertices on a boundary between the inner annular portion and the outer annular portion.

11. The substrate support as claimed in claim 10, wherein the inner annular portion has a width in a range of 0.1 mm to 5.0 mm.

12. The substrate support as claimed in claim 1, wherein the insulating material includes a ceramic material.

13. The substrate support as claimed in claim 1,
    wherein the substrate support layer includes an annular protrusion protruding upward from an upper surface of the substrate support layer, and
    wherein the annular protrusion overlaps the plurality of protruding portions in a plan view.

14. The substrate support as claimed in claim 1, wherein the electrostatic internal electrode layer has a symmetric shape in a plan view.

15. The substrate support as claimed in claim 1, wherein the electrostatic internal electrode layer has an asymmetric shape in a plan view.

16. The substrate support as claimed in claim 1,
    wherein the substrate support layer includes an annular edge region in a plan view,
    wherein the annular edge region includes an inner annular portion and an outer annular portion, and
    wherein each of the plurality of protruding portions has a substantially triangular shape having one vertex on a boundary between the inner annular portion and the outer annular portion.

17. The substrate support as claimed in claim 16, wherein each of the plurality of protruding portions has an angle of 90 degrees or less at the vertex.

18. The substrate support as claimed in claim 1,
    wherein the substrate support has an annular edge region in a plan view,
    wherein the annular edge region has an inner annular portion and an outer annular portion, and
    wherein each of the plurality of protruding portions has a substantially rectangular shape having two vertices on a boundary between the inner annular portion and the outer annular portion.

* * * * *